United States Patent
Yonezawa et al.

(10) Patent No.: US 7,246,430 B2
(45) Date of Patent: Jul. 24, 2007

(54) ELECTRONIC COMPONENT MOUNTING APPARATUS AND ELECTRONIC COMPONENT MOUNTING METHOD

(75) Inventors: Takahiro Yonezawa, Neyagawa (JP); Ken Kobayashi, Hirakata (JP); Mikio Hasegawa, Neyagawa (JP); Hiroshi Nasu, Neyagawa (JP); Makoto Imanishi, Hirakata (JP); Katsuhiko Watanabe, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 232 days.

(21) Appl. No.: 10/857,940

(22) Filed: Jun. 2, 2004

(65) Prior Publication Data

US 2005/0071991 A1     Apr. 7, 2005

(30) Foreign Application Priority Data

| Jun. 3, 2003 | (JP) | ............................. 2003-157937 |
| Mar. 31, 2004 | (JP) | ............................. 2004-103755 |
| Mar. 31, 2004 | (JP) | ............................. 2004-103756 |

(51) Int. Cl.
  *B23P 19/00*   (2006.01)
(52) U.S. Cl. .......................................... 29/740; 29/739
(58) Field of Classification Search .................. 29/739, 29/740, 741
  See application file for complete search history.

(56) References Cited

U.S. PATENT DOCUMENTS 3,641,651 A * 2/1972 Rockwell et al. ............. 29/701
6,178,621 B1 * 1/2001 Shida et al. ................... 29/740
6,892,447 B1 * 5/2005 Yamauchi et al. ............ 29/740
2001/0047586 A1 * 12/2001 Kawai et al. .................. 29/833

FOREIGN PATENT DOCUMENTS

| JP | 4-94553    | 3/1992  |
| JP | 4-223349   | 8/1992  |
| JP | 8-203966   | 8/1996  |
| JP | 10-163273  | 6/1998  |
| JP | 11-297764  | 10/1999 |

* cited by examiner

*Primary Examiner*—Carl J. Arbes
(74) *Attorney, Agent, or Firm*—Wenderoth, Lind & Ponack, L.L.P.

(57) ABSTRACT

In an electronic component mounting apparatus, a vertical load and horizontal loads applied to an electronic component are detected by a load sensor that has piezoelectric elements provided in a stack in a mounting direction of the electronic component. Therefore, a size in a horizontal direction of the load sensor can be reduced, and a load applied to the electronic component can be detected at a neighborhood of a mounting position of the electronic component. Moreover, by comparing a position, in a two-dimensional space in which load values in an X-direction and Y-direction of the horizontal load serve as coordinate values, with a tolerance range in the two-dimensional space, a mounting failure can be detected from a deviation in the horizontal loads.

18 Claims, 10 Drawing Sheets

ELECTRONIC COMPONENT MOUNTING APPARATUS AND ELECTRONIC COMPONENT MOUNTING METHOD

BACKGROUND OF THE INVENTION

The present invention relates to an electronic component mounting apparatus and electronic component mounting method for mounting electronic components of, for example, semiconductor bare chips, electronic circuit packages and the like onto a board.

Conventionally, in mounting an electronic component such as a semiconductor bare chip with bumps onto a board, there has been adopted a method for bonding the bumps to electrodes on the board by applying a load to the electronic component against the electrodes. According to this method, it is required to control a value of a load applied to each bump within a prescribed range, and therefore, mounting of the electronic component has been performed while measuring a load applied to the electronic component by use of a load sensor such as a load cell.

FIG. 12 shows a construction of a conventional electronic component mounting apparatus. In conventional electronic component mounting apparatus 100, a movement block that moves in a Z-direction is divided into a first movement block 110 and a second movement block 120, and a nut section 121 provided in the second movement block 120 is meshed with a feed screw 151 that is rotationally driven by a motor 150. Moreover, the first movement block 110 and the second movement block 120 are joined so as to be pulled together by a spring 122, and a load cell 130, which is a load sensor, is provided between the first movement block 110 and the second movement block 120. A slider 111 is provided on a side surface of the first movement block 110 and slides on a guide rail 112 provided in the Z-direction.

A lower end portion of the first movement block 110 is provided with a shaft 113, whose central axis is arranged in the Z-direction, and a holding head 115 for sucking and holding an electronic component 101 by a negative pressure, in this order. Moreover, a table 140 movable in an X-direction and a Y-direction is provided below the holding head 115, and a board 102 is placed on the table 140. An output of the load cell 130 is inputted to a control section 160, and the control section 160 controls driving of the motor 150 while monitoring an output of the load cell 130.

When mounting the electronic component 101 onto the board 102, the motor 150 is rotationally driven in a prescribed direction to move down the second movement block 120 and the first movement block 110 in the Z-direction. When the electronic component 101 is brought into contact with the board 102, a load detected by the load cell 130 gradually increases, and the electronic component 101 is pressurized. At this time, by applying, for example, ultrasonic waves while pressurizing the electronic component 101 with a prescribed load, bumps 101a provided at a bottom of the electronic component 101 are connected to a wiring pattern on the board 102 and then mounted. Subsequently, the holding head 115 is separated from the electronic component 101, and the second movement block 120 and the first movement block 110 are moved up in the Z-direction.

As a prior art relevant to the conventional electronic component mounting apparatus, Japanese unexamined patent publication No. 10-163273 discloses an electronic component mounting apparatus in which the first movement block and the second movement block are joined together via an air cylinder instead of joining the first movement block and the second movement block together by a spring. Japanese unexamined patent publication No. 08-203966 discloses an electronic component mounting apparatus in which a voicecoil motor is employed in place of the motor and screw feed mechanism in order to move the movement block in the Z-direction, and the holding head is attached to a shaft driven in the Z-direction by the voicecoil motor. Further, in Japanese unexamined patent publication No. 08-203966, a pressurizing force is estimated from a current applied to the voicecoil motor using no load sensor like the load cell.

Japanese unexamined patent publication No. 11-297764 discloses an electronic component mounting apparatus in which an electronic component and a board surface are made parallel to each other by detecting a pressure during bonding by use of load sensors provided in a plurality of places on a holding head side and adjusting an inclination of a lower surface of the holding head so that a value of the pressure becomes uniform.

Japanese unexamined patent publication No. 04-94553 discloses an electronic component mounting apparatus in which, in a bonding device for performing bonding by pressurizing a tape board against an electronic component placed on a table with bumps directed upward, inclination of the table is adjusted so that a pressurizing surface of a bonding tool and a bonding surface of the electronic component become parallel to each other on the basis of pressurizing forces detected by strain gauges provided in a plurality of places of the bonding tool that holds the tape board. Japanese unexamined patent publication No. 04-223349 discloses an electronic component mounting apparatus in which inclination of a stage is adjusted on the basis of outputs of load sensors provided in a plurality of places of a table. Further, Japanese unexamined patent publication No. 04-223349 discloses a technique for making a pressurizing force of a bonding tool coincide with a pressurizing pattern by performing feedback control on the basis of an output of another load sensor provided for a bonding tool.

In the conventional electronic component mounting apparatus 100 shown in FIG. 12, the load cell 130 is positioned between the first movement block 110 and the second movement block 120, and the slider 111 and the guide rail 112 are provided on a (−Z) side (lower side) of the load cell 130. Generation of some degree of sliding resistance (e.g., about 30 gf) cannot be avoided when the slider 111 slides on the guide rail 112, and a load detected by the load cell 130 includes an error due to this sliding resistance. Therefore, if driving of the motor 150 is controlled on the basis of the load detected by the load cell 130, then there occur variations in a load applied to the electronic component 101. If a load actually applied to the electronic component 101 is extremely smaller than a required load, then a sufficient strength for bonding between the electronic component 101 and the board 102 cannot be obtained, thereby possibly causing contact failure or the like. Conversely, if a load actually applied to the electronic component 101 is extremely larger than a required load, there is the possibility of occurrence of collapse of bumps 101a at a bottom of the electronic component 101 or damage of the electronic component 101 itself.

Moreover, since only a load in the Z-direction is detected by the load cell 130 in the electronic component mounting apparatus 100, if the electronic component 101 is inclined with respect to a surface of the board 102, then a load is not uniformly applied to the bumps 101a at the bottom of the electronic component 101, thereby possibly causing contact failure of some bumps and collapse of some bumps. Such an issue occurs similarly in the electronic component mounting apparatus of Japanese unexamined patent publication No. 10-163273. Moreover, a load applied to the electronic component is detected only in the Z-direction also in the electronic component mounting apparatus of Japanese unexamined patent publication No. 08-203966, and measurement is performed indirectly. Accordingly, there are possibilities of contact failure between an electronic component and a board, collapse of bumps and damage of the electronic component itself.

In the electronic component mounting apparatuses of Japanese unexamined patent publication Nos. 11-297764, 04-94553 and 04-223349, it is possible to detect an inclination of an electronic component and a board by use of a plurality of load sensors arranged in a horizontal detection. However, it is required to separately provide the load sensors in a plurality of places of the apparatus in order to appropriately measure a load. Conversely, if the load sensors are separated from a mounting position, regions occupied by the load sensors are disadvantageously increased. That is, according to a technique of arranging a plurality of load sensors in a horizontal direction, there is a limit to accuracy of sensor sections in detecting inclination of an electronic component with respect to a board surface, and it becomes difficult to accurately detect a mounting failure.

Moreover, in order to remove the above issue that when the electronic component 101 is inclined with respect to the surface of the board 102, the load is not uniformly applied to the bumps 101a at the bottom of the electronic component 101, thereby possibly causing a contact failure of some bumps and collapse of some bumps, it is possible to use, for example, an air bearing in order to reduce sliding resistance when the movement block is moved in the Z-direction. However, although a load can be supported by the air bearing when the load applied to the electronic component is small (e.g., about 300 gf), the air bearing cannot be used when a load that exceeds a prescribed limit is applied. Such issue occurs similarly in the electronic component mounting apparatus of Japanese unexamined patent publication No. 10-163273.

In the electronic component mounting apparatus of Japanese unexamined patent publication No. 08-203966, the holding head is moved while being attached to the shaft driven in the Z-direction by the voicecoil motor, and therefore, a sliding resistance is generated similarly to the case of FIG. 12. Moreover, since a load applied to the electronic component is indirectly measured, there are possibilities of occurrence of a contact failure between an electronic component and a board, collapse of the bumps and damage of the electronic component itself, as described above.

Likewise, in the electronic component mounting apparatuses of Japanese unexamined patent publication Nos. 11-297764, 04-94553 and 04-223349, a load applied to an electronic component is indirectly measured by an inclination adjustment mechanism or the like, and therefore, it is difficult to accurately measure a load actually applied to the electronic component. Therefore, it is difficult to accurately perform adjustment of inclination of an electronic component with respect to a board surface on the basis of outputs from the load sensors, and there is a limit to prevention of a mounting failure of the electronic component with an improvement in accuracy. Moreover, it is required to separately provide load sensors in a plurality of places of the apparatus in order to improve measurement accuracy of a load, and it is difficult to detect the load in the neighborhood of a mounting position.

The present invention has been accomplished to solve the aforementioned conventional issues and has an object to provide an electronic component mounting apparatus capable of accurately detecting a mounting failure of an electronic component by detecting a load in a neighborhood of a mounting position.

Another object of the present invention is to solve the aforementioned conventional issues and provide an electronic component mounting apparatus capable of accurately measuring a load actually applied to an electronic component by eliminating influence of an error due to sliding resistance when a movement block moves.

SUMMARY OF THE INVENTION

In accomplishing these and other aspects, according to a first aspect of the present invention, there is provided an electronic component mounting apparatus for mounting an electronic component onto a board, the apparatus comprising:

a board holding section for holding the board;

a holding head for holding the electronic component;

a load sensor which is attached to the holding head or the board holding section and has two piezoelectric elements for generating voltages upon receiving horizontal loads in two directions that are roughly perpendicular to a mounting direction of the electronic component and roughly mutually intersect each other, with the piezoelectric elements being stacked in the mounting direction; and a mounting failure detection section for comparing a position, in a two-dimensional space in which horizontal load values in the two directions detected by the load sensor serve as coordinate values, with a preset tolerance range in the two-dimensional space, and thus detecting a mounting failure of the electronic component.

According to a second aspect of the present invention, there is provided the electronic component mounting apparatus as defined in the first aspect, further comprising:

a storage section for preparatorily storing a load profile that expresses a time-based change in a load value in a direction roughly parallel to the mounting direction to be applied to the electronic component during mounting, with the load sensor further comprising a piezoelectric element for generating a voltage upon receiving a vertical load in the direction roughly parallel to the mounting direction, with the piezoelectric element being stacked on the two piezoelectric elements, and with the mounting failure detection section detecting a mounting failure of the electronic component by comparing a value of the vertical load detected by the load sensor with the load profile stored in the storage section.

According to a third aspect of the present invention, there is provided the electronic component mounting apparatus as defined in the first or second aspect, wherein a tolerance range in the two-dimensional space is expanded or contracted around an origin of the two-dimensional space on basis of a load profile.

According to a fourth aspect of the present invention, there is provided the electronic component mounting apparatus as defined in the third aspect, wherein the tolerance range in the two-dimensional space is a circular or elliptical region centered around the origin.

According to a fifth aspect of the present invention, there is provided the electronic component mounting apparatus as defined in the first or second aspect, wherein a foreign object intruding between the electronic component and the holding head or the board, or between the board and the board holding section, during mounting is detected by the mounting failure detection section.

According to a sixth aspect of the present invention, there is provided an electronic component mounting method for mounting an electronic component onto a board, the method comprising:

holding a board by use of a board holding section;

holding an electronic component by use of a holding head;

mounting the electronic component onto the board;

detecting horizontal loads in two directions that are roughly perpendicular to a mounting direction of the electronic component and roughly mutually intersect each other, by use of a load sensor that has two piezoelectric elements attached to the holding head or the board holding section, during the mounting; and detecting a mounting failure of the electronic component by comparing a position in a two-dimensional space in which horizontal load values in the two directions detected by the load sensor serve as coordinate values with a preset tolerance range in the two-dimensional space.

According to a seventh aspect of the present invention, there is provided an electronic component mounting apparatus for mounting an electronic component on a board, the apparatus comprising:

a movement block capable of being driven in a mounting direction of the electronic component;

a holding head which is an integrated block of high rigidity for holding the electronic component;

a load sensor which is provided between the movement block and the holding head and supports the holding head, for detecting a vertical load value in a direction roughly parallel to the mounting direction;

a guide mechanism for movably guiding the movement block in the mounting direction; and a drive mechanism for driving the movement block in the mounting direction.

According to an eighth aspect of the present invention, there is provided the electronic component mounting apparatus as defined in the seventh aspect, further comprising:

a storage section for preparatorily storing a load profile that expresses a time-based change in a load value in a direction roughly parallel to the mounting direction to be applied to the electronic component during mounting;

a control section for controlling driving of the movement block according to the load profile; and a mounting failure detection section for detecting a mounting failure of the electronic component by comparing the vertical load value in the direction roughly parallel to the mounting direction, as detected by the load sensor, with the load profile.

According to a ninth aspect of the present invention, there is provided the electronic component mounting apparatus as defined in the eighth aspect, further comprising:

a displacement sensor for detecting a displacement amount, in the direction roughly parallel to the mounting direction, of the holding head, with the mounting failure detection section detecting a mounting failure of the electronic component by comparing the displacement amount of the holding head from a start to an end of mounting, as detected by the displacement sensor, with a reference displacement amount preparatorily stored in the storage section.

According to a tenth aspect of the present invention, there is provided the electronic component mounting apparatus as defined in any one of the seventh through ninth aspects, wherein the load sensor is a piezoelectric element.

According to an eleventh aspect of the present invention, there is provided the electronic component mounting apparatus as defined in the tenth aspect, wherein the load sensor has three piezoelectric elements for generating voltages upon receiving a vertical load roughly parallel to the mounting direction and horizontal loads in two directions that are roughly perpendicular to the mounting direction and roughly mutually intersect each other.

According to a twelfth aspect of the present invention, there is provided the electronic component mounting apparatus as defined in the eleventh aspect, wherein the mounting failure detection section detects a mounting failure of the electronic component by comparing a position, in a two-dimensional space in which horizontal load values in the two directions as detected by the load sensor serve as coordinate values, with a tolerance range in the two-dimensional space preparatorily stored in the storage section.

According to a thirteenth aspect of the present invention, there is provided the electronic component mounting apparatus as defined in the tenth aspect, wherein the piezoelectric element is made of a piezoelectric ceramic or crystal.

According to a fourteenth aspect of the present invention, there is provided the electronic component mounting apparatus as defined in any one of the seventh through ninth aspects, wherein the electronic component is a semiconductor bare chip.

According to a fifteenth aspect of the present invention, there is provided the electronic component mounting apparatus as defined in any one of the seventh through ninth aspects, wherein the electronic component is bonded to the board via a thermosetting resin by being heated with a prescribed load applied thereto.

According to a sixteenth aspect of the present invention, there is provided the electronic component mounting apparatus as defined in any one of the seventh through ninth aspects, wherein the electronic component is bonded to the board by ultrasonic waves applied with a prescribed load applied thereto.

According to a seventeenth aspect of the present invention, there is provided the electronic component mounting apparatus as defined in any one of the seventh through ninth aspects, wherein the load sensor comprises:

an attachment face to which the holding head is affixed; and an another attachment face that is parallel to the attachment face and attached to the movement block.

According to an eighteenth aspect of the present invention, there is provided an electronic component mounting method for mounting an electronic component onto a board, the method comprising:

holding a board by use of a board holding section;

holding the electronic component by a holding head that is an integrated block of high rigidity attached to a movement block driven in a mounting direction of the electronic component via a load sensor;

mounting the electronic component onto the board by driving the movement block in the mounting direction along a guide mechanism; and detecting a vertical load in a direction roughly parallel to the mounting direction by use of the load sensor simultaneously with the mounting of the electronic component.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
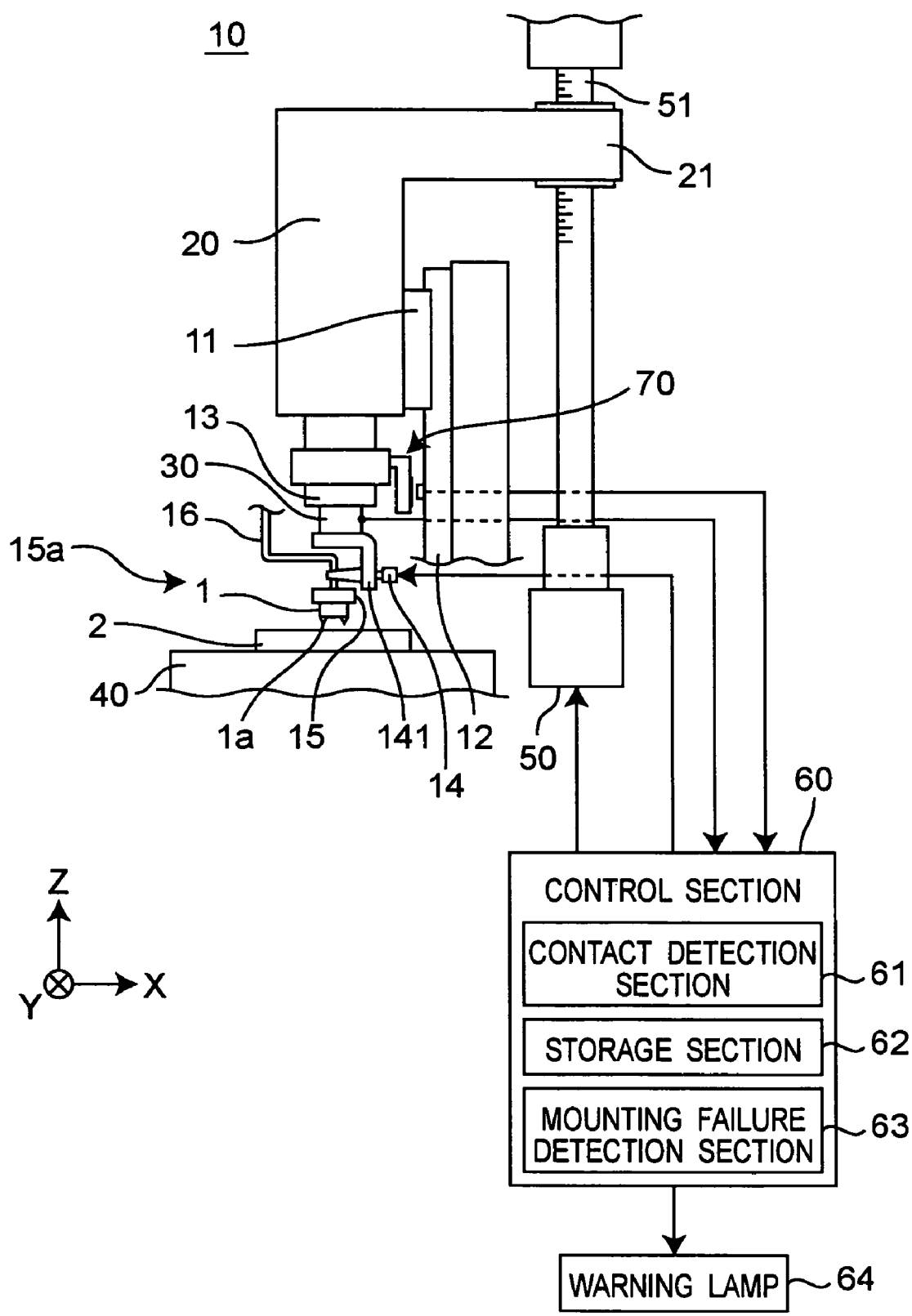
FIG. 1 a front view showing a construction of an electronic component mounting apparatus according to a first embodiment of the present invention.

Before description of the present invention proceeds, it is to be noted that like parts are designated by like reference numerals throughout the accompanying drawings.

Embodiments of the present invention will be described in detail below on the basis of the drawings.

The present invention is related to an electronic component mounting apparatus capable of accurately detecting a mounting failure of an electronic component by detecting a load in a neighborhood of a mounting position and accurately measuring a load applied to the electronic component by eliminating influence of a sliding resistance of a guide mechanism with a load sensor provided in a neighborhood of a holding head. An electronic component mounting apparatus according to one embodiment of the present invention will be described below with reference to the drawings.

FIG. 1 is a view showing construction of electronic component mounting apparatus 10 according to a first embodiment of the present invention, wherein the electronic component mounting apparatus 10 mounts an electronic component 1 that is a semiconductor bare chip onto a board 2 on which circuit wiring is formed.

In the electronic component mounting apparatus 10, a nut section 21 provided in a movement block 20 that moves in a Z-direction is meshed with a feed screw 51 that is rotationally driven by a motor 50. A slider 11 is provided on a side surface of the movement block 20 and slides on a guide rail 12 directed in the Z-direction. The slider 11 and the guide rail 12 serve as a guide mechanism for movably guiding the movement block 20 in a mounting direction of the electronic component 1. Moreover, the motor 50, the feed screw 51 and the nut section 21 of the movement block 20 constitute a drive mechanism for driving the movement block 20 in the mounting direction of the electronic component 1.

At a lower end portion of the movement block 20 are provided a shaft 13 whose central axis is arranged in the Z-direction, a load sensor 30 that has a piezoelectric element for measuring a load applied to the electronic component 1, a block 141 to which an ultrasonic vibrator 14 is attached, and a holding section 15 for sucking and holding the electronic component 1 by a negative pressure, which are arranged in this order. The holding section 15, the block 141, and members provided between the holding section 15 and the block 141 are assembled as a holding head 15a that is an integrated block of high rigidity. Piping 16 connected to a vacuum pump (not shown) is connected to the holding section 15, and the electronic component 1 is sucked by suction from a suction port formed on a lower surface of the holding section 15. An optical system (optical interference system) linear scale 70, which is a displacement sensor for detecting a displacement amount in the Z-direction of the holding head 15a (mounting direction of the electronic component 1), is provided on a (+X) side of the shaft 13. Outputs of the linear scale 70 and the load sensor 30 are inputted to a control section 60.

A table 40, which can be moved in an X-direction and a Y-direction, is provided below the holding head 15a, and the board 2 is placed and held on the table 40. It is to be noted that a mechanism for feeding the electronic component 1, and a camera for detecting a relative position of the electronic component 1 with respect to the board 2, and the like are not shown in the figures.

Figure 2:
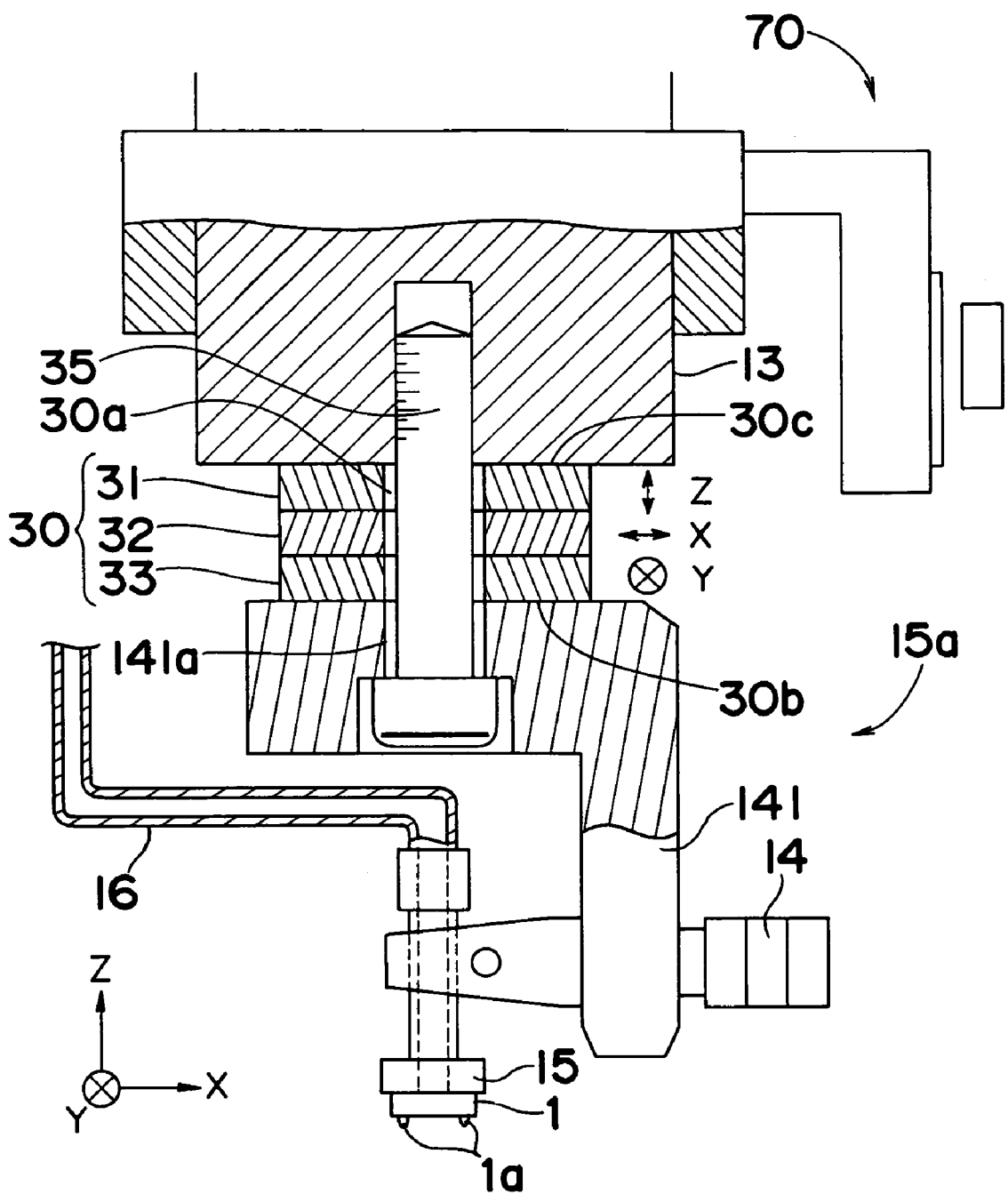
FIG. 2 is a sectional view showing an installation structure of a holding head and a load sensor of the electronic component mounting apparatus of the first embodiment.

FIG. 2 shows an installation structure of the load sensor 30 and the holding head 15a. The block 141 to which the ultrasonic vibrator 14 is attached and the load sensor 30 are provided with through holes 141a and 30a through which a bolt 35 penetrates, and the block 141 and the load sensor 30 are attached to the shaft 13 by the bolt 35 so that the load sensor 30 is interposed between the block 141 and the shaft 13 of the movement block 20. That is, the holding head 15a is attached so as to be supported by substantially only the load sensor 30. Moreover, the holding section 15 is attached to the block 141 by a bolt (not shown).

In the load sensor 30, three flat-plate-shaped piezoelectric elements 31, 32 and 33 are stacked in layers in the Z-direction (mounting direction of the electronic component 1). For example, a direction of polarization of the piezoelectric element 31 located as an uppermost layer is determined so that a voltage is generated upon receiving a load (load in a direction perpendicular to the board 2, hereinafter referred to as a "vertical load") in a direction roughly parallel to the mounting direction of the electronic component 1 (Z-direction shown in FIG. 1, and this is not necessarily required to coincide with a gravitational direction). Likewise, directions of polarization of the piezoelectric elements 32 and 33 located as an intermediate layer and a lowermost layer are determined so that a voltage is generated upon receiving a load (hereinafter referred to as a "horizontal load") in two directions (X-direction and Y-direction) that are roughly perpendicular to the mounting direction of the electronic component 1 and roughly perpendicular to each other.

The load sensor 30 has an attachment face 30b to which the holding head 15a is directly attached and another attachment face 30c that is parallel to the attachment face 30b and attached to the shaft 13 of the movement block 20. With this arrangement, it is possible to attach to and detach the load sensor 30 from the shaft 13 by use of one bolt 35 easily in a prescribed posture.

Figure 3:
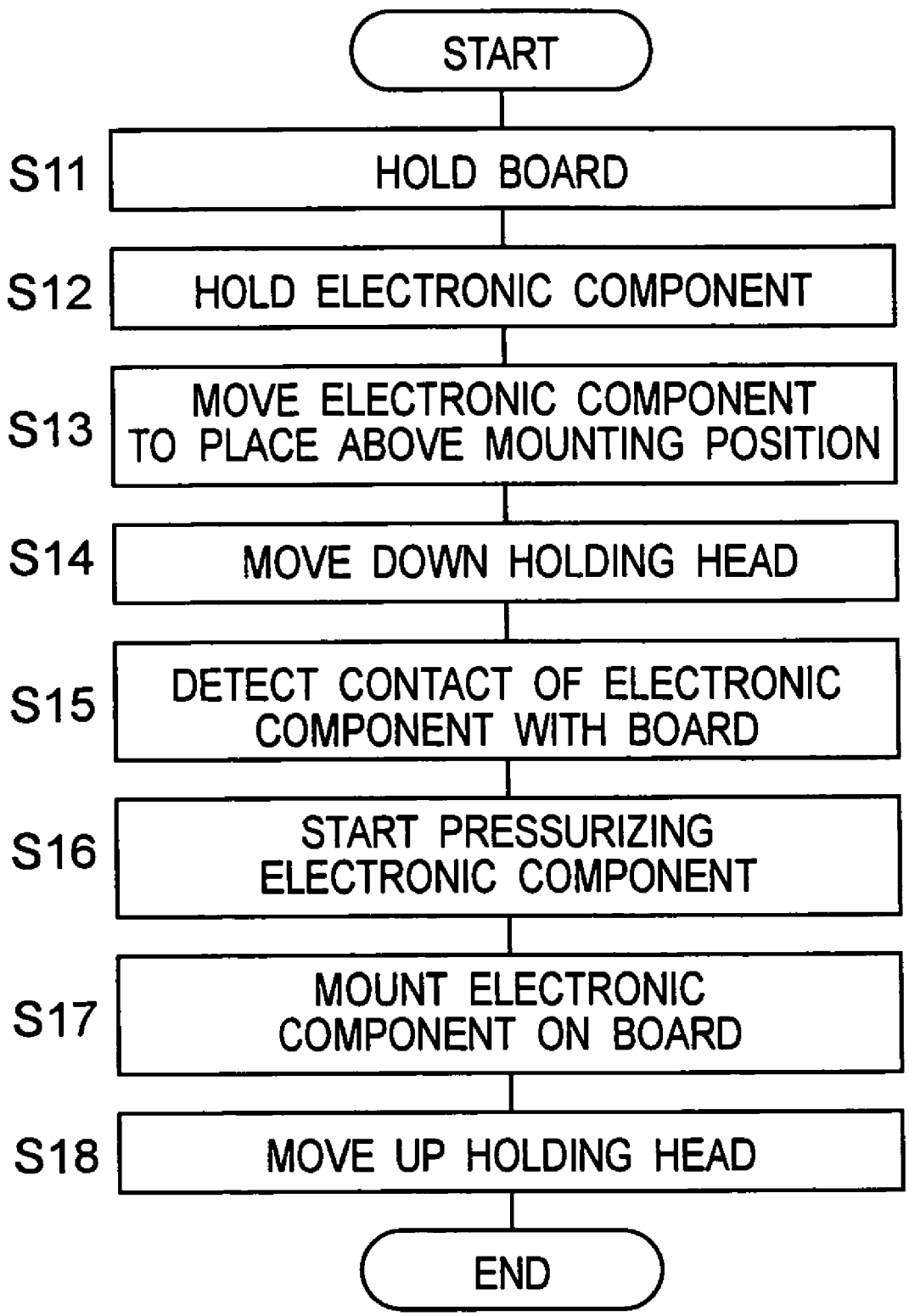
FIG. 3 is a chart showing flow of an electronic component mounting operation of the electronic component mounting apparatus of the first embodiment.

FIG. 3 is a chart showing flow of an operation of the electronic component mounting apparatus 10 in mounting the electronic component 1 onto the board 2. In mounting the electronic component 1 onto the board 2, the board 2 is first placed and held on the table 40 (step S11), and the holding section 15 receives the electronic component 1 from a feed mechanism and holds the component by vacuum suction (step S12). Subsequently, the electronic component 1 moves to a place above a mounting position on the board 2, and alignment of a relative position of the electronic component 1 held by the holding section 15 with respect to the board 2 is performed (step S13).

Next, the motor 50 is rotationally driven in a prescribed direction to move down the holding section 15 together with the movement block 20 in a (−Z)-direction (step S14), so that the electronic component 1 is brought into contact with the board 2. Contact of the electronic component 1 with the board 2 is accurately detected by a contact detection section 61 of the control section 60 shown in FIG. 1 on a basis of an output of the load sensor 30 (step S15). When a required accuracy of detection of the contact of the electronic component 1 with the board 2 is not comparatively high, the contact may be detected by a relationship between a displacement amount in the Z-direction (mounting direction) of the electronic component 1 detected by linear scale 70 and a current supplied to the motor 50 (torque of the motor). Moreover, it is acceptable to detect descent of the holding head 15a by a prescribed distance according to an output from an encoder of the motor 50, and regard this detection as contact of the electronic component 1 with the board 2.

Figure 4:
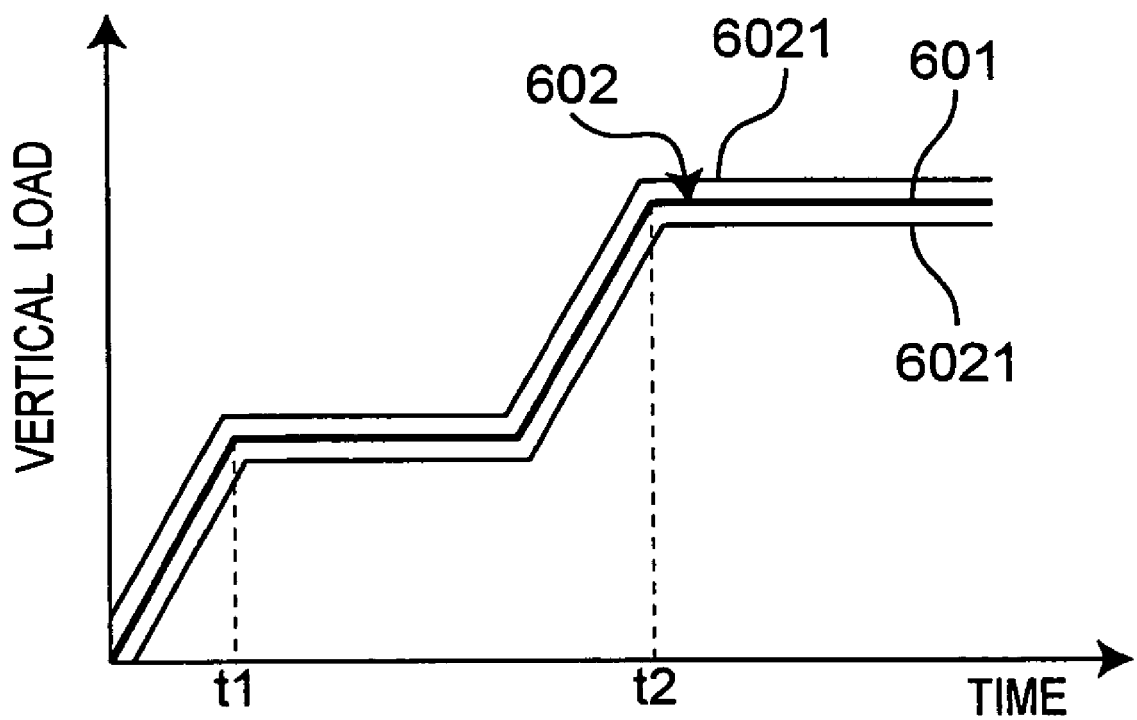
FIG. 4 is a graph showing a load profile of the electronic component mounting apparatus of the first embodiment.

FIG. 4 is a graph showing a load profile 601, representing a time-based change in vertical load to be applied to the electronic component 1 at a time of mounting, and the load profile 601 has preparatorily been stored in a storage section 62 of the control section 60. The load profile 601 shown in FIG. 4 represents the fact that a load gradually increases from a start of mounting to a time t1, pressurization with a prescribed load is effected only for a prescribed time from the time t1, the load further increases to a time t2, and thereafter pressurization is effected for a prescribed time from the time t2. It is to be noted that a configuration of the load profile 601 is variously changed in accordance with types of the electronic component 1 and the board 2, a mounting method, and the like.

When the contact of the electronic component 1 with the board 2 is detected in step S15, driving of the movement block 20 is controlled by the control section 60 according to the load profile 601, and pressurization of the electronic component 1 is started (step S16). Then, in a state in which the electronic component 1 is pressurized with a prescribed load as a consequence of a gradual increase in the load detected by the load sensor 30, the ultrasonic vibrator 14 is activated by a signal from the control section 60 to apply ultrasonic waves to the electronic component 1. Consequently, bumps 1a provided at a bottom of the electronic component 1 are bonded to the wiring pattern on the board 2, so that mounting is performed concurrently with placement (step S17).

Subsequently, a valve (not shown) provided for the piping 16 is opened with blowing effected from the holding section 15 via the piping 16, and the holding section 15 is separated from the electronic component 1. Then, the motor 50 is rotationally driven in a reverse direction to move up the movement block 20 (and the holding head 15a) in a (+Z)-direction, thereby completing the mounting of the electronic component 1 (step S18).

Figure 5:
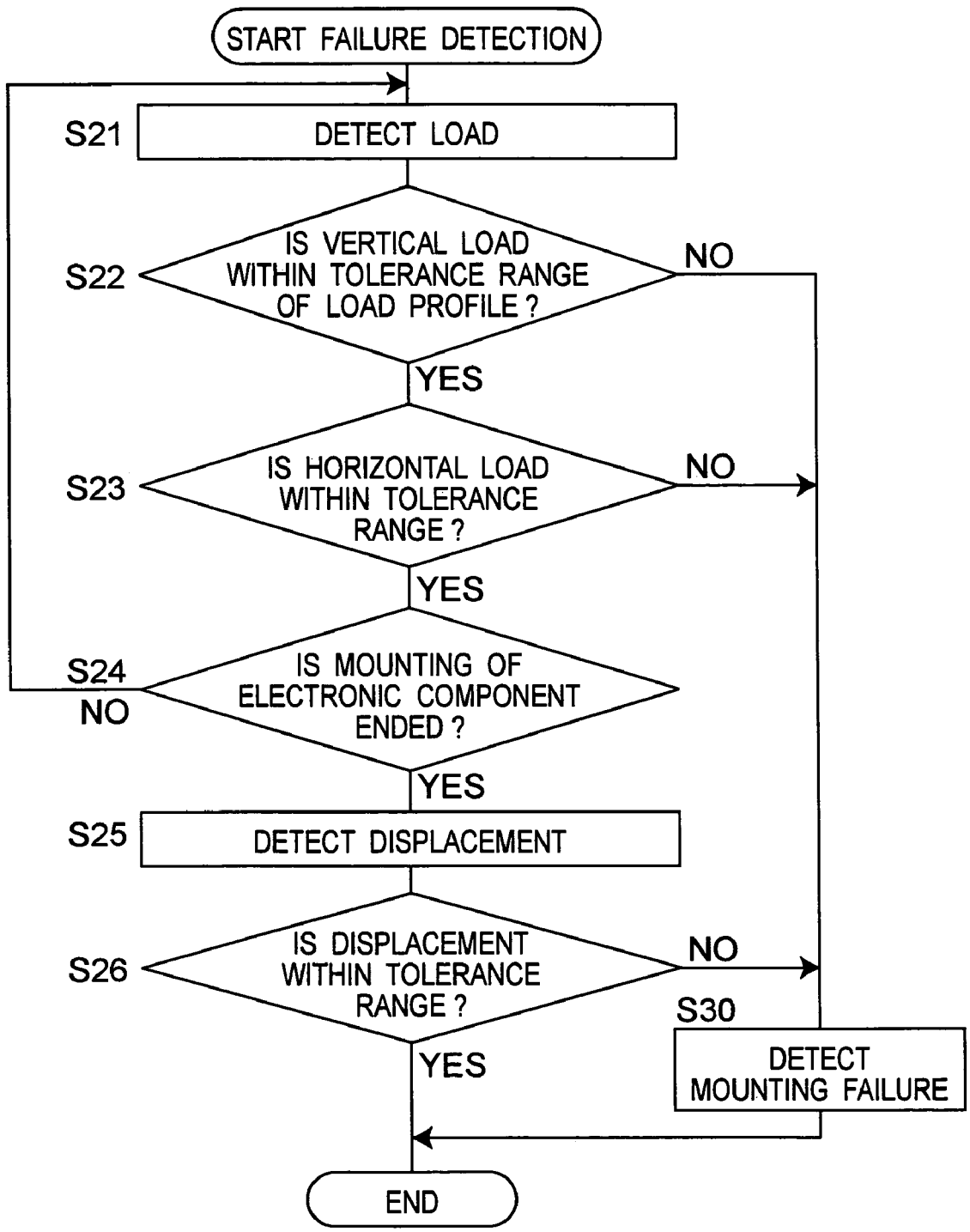
FIG. 5 is a chart showing flow of operation for detecting a mounting failure of an electronic component of the electronic component mounting apparatus of the first embodiment.

In the electronic component mounting apparatus 10, if some trouble occurs in the load applied to the electronic component 1 or the displacement of the electronic component 1 in mounting of the electronic component 1 onto the board 2 (steps S16 and S17), then a mounting failure (abnormality) of the electronic component 1 is detected by the control section 60 on a basis of outputs from the load sensor 30 and the linear scale 70. FIG. 5 is a chart showing a flow of operation for detecting a mounting failure of the electronic component 1 in the electronic component mounting apparatus 10. Hereinafter, a failure detection operation in mounting the electronic component 1 (e.g., failure detection operation performed simultaneously with a mounting process of the electronic component 1) will be described below with reference to FIG. 5 and other figures.

First of all, if contact of the electronic component 1 with the board 2 is detected and pressurization of the electronic component 1 is started, then a load applied to the electronic component 1 is detected by the load sensor 30 and transferred to the control section 60 (step S21). A vertical load detected by the piezoelectric element 31 is compared with the load profile 601 stored in the storage section 62 to confirm whether or not the load is within a tolerance range (range between lines 6021 located above and below the load profile 601) 602 of the load profile 601 shown in FIG. 4 (step S22) moreover, simultaneously with detection of contact of the electronic component 1 with the board 2, measurement of a displacement amount of the holding head 15a by the linear scale 70 is also started.

If it is determined that the vertical load is outside the tolerance range 602 of the load profile 601 by a mounting failure detection section 63 (see FIG. 1) of the control section 60, an operator is informed of this detection of the mounting failure of the electronic component 1 by lighting a warning lamp 64 provided for the electronic component mounting apparatus 10 (step S30). For example, if a sliding failure or the like of the slider 11 or the guide rail 12 occurs, then a detected vertical load sometimes has a small value outside the tolerance range 602 of the load profile 601. In this case, there is a possibility of an occurrence of defective bonding of the bumps 1a to the board 2 due to a shortage of pressure of the electronic component 1 against the board 2, and such mounting failure is detected by the mounting failure detection section 63.

Figure 6:
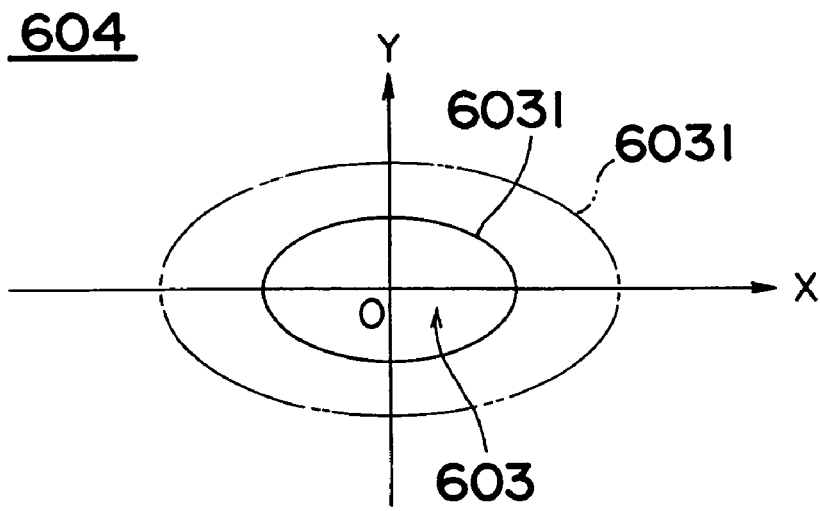
FIG. 6 is a chart showing a tolerance range of a horizontal load applied to the electronic component of the electronic component mounting apparatus of the first embodiment.

If it is determined that the vertical load is within the tolerance range 602 of the load profile 601, then a horizontal load detected by the piezoelectric elements 32 and 33 are next compared with a tolerance range of the horizontal load preparatorily stored in the storage section 62. FIG. 6 is a chart showing a tolerance range 603 of the horizontal load applied to the electronic component 1 in a two-dimensional space 604 in which the X-direction and the Y-direction of the load serve as an X-axis and Y-axis. The tolerance range 603 is a region of a circle or an ellipse (another shape may sometimes be adopted according to a configuration and the like of the electronic component 1) which is centered at an origin of the two-dimensional space 604 encircled by a line 6031, and this region is expanded or contracted around the origin located at a center on the basis of the load profile 601. In FIG. 6, the line 6031 indicated by the solid line indicates the tolerance range 603 at time t1 of the load profile 601 shown in FIG. 4. If pressurization of the electronic component 1 is promoted and the pressurization enters a state of the load profile 601 at time t2, then the region is expanded to a position indicated by the two-dot chain line on the basis of the value or the like of the vertical load represented by the load profile 601 at time t2.

In the mounting failure detection section 63 of the control section 60, a position, in which horizontal load values in the X-direction and the Y-direction detected by the load sensor 30 serve as coordinate values, is compared with the tolerance range 603 (step S23). When the position is outside the tolerance range 603, the operator is informed of detection of a mounting failure of the electronic component 1 by lighting the warning lamp 64 (step S30). As the case of the mounting failure detected in step S23, it can be considered, for example, a case where the electronic component 1 is held inclined with respect to the board 2 due to suction failure of the holding section 15, intrusion of a foreign object or the like, and a case where a foreign object intrudes between some bumps 1a and the board 2.

Figure 7:
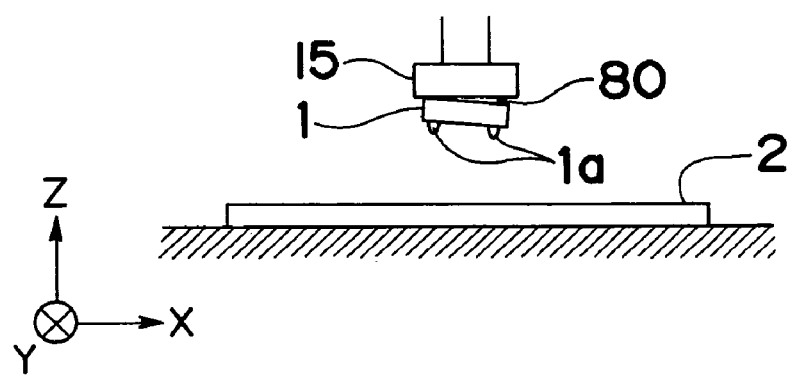
FIG. 7 is a view showing a neighborhood of the electronic component of the electronic component mounting apparatus of the first embodiment.
Figure 8:
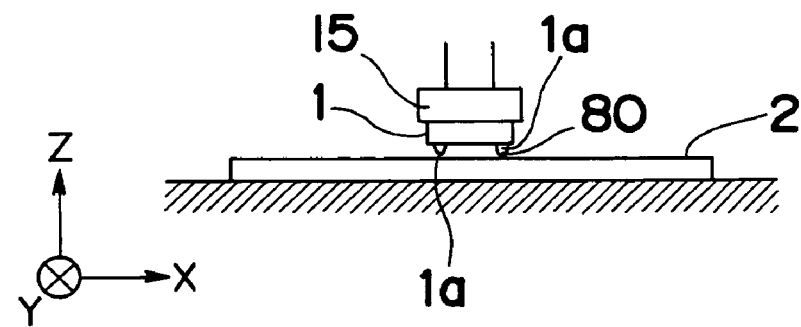
FIG. 8 is a view showing a neighborhood of the electronic component of the electronic component mounting apparatus of the first embodiment.
Figure 9:
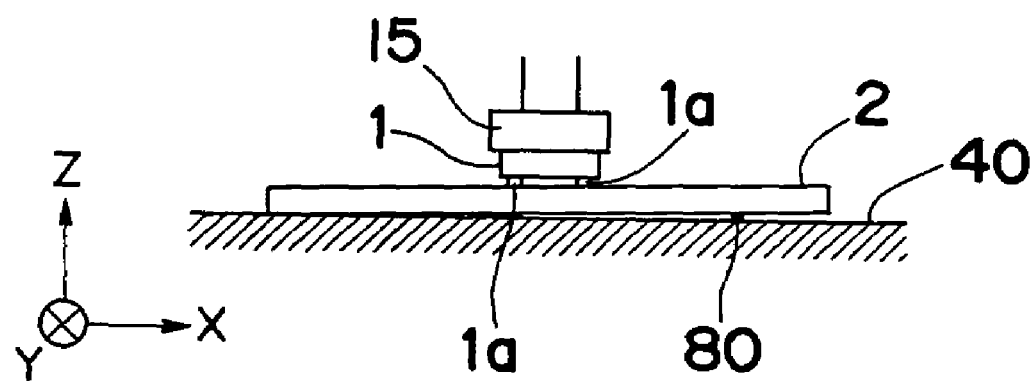
FIG. 9 is a view showing a neighborhood of the electronic component of the electronic component mounting apparatus of the first embodiment.

FIGS. 7 through 9 are views showing a neighborhood of the electronic component 1 held by the holding section 15. As shown in FIGS. 7 through 9, when intrusion of a foreign object 80 occurs on a (+X) side with respect to a center of the electronic component 1 between the electronic component 1 and the holding section 15 or the board 2, or between the board 2 and the table 40, a bump 1a located on the (+X) side of the electronic component 1 is brought into contact with the board 2 (via the foreign object 80 in the case shown in FIG. 8) earlier than a bump 1a located on a (−X) side, and pressurization of the electronic component 1 is started from this state. At this time, due to concentration of load on the bump 1a located on the (+X) side, position in two-dimensional space 604 of the horizontal load detected by the load sensor 30 deviates from the origin to the (+X) side and becomes located outside the tolerance range 603. In this case, a load is not uniformly applied to the bumps 1a at the bottom of the electronic component 1, thereby possibly causing collapse of the bump 1a located on the (+X) side due to the concentration of the load, defective bonding between the bump 1a located on the (−X) side and the board 2, and further damage of the electronic component 1 itself due to non-uniform pressurization. A mounting failure caused by such deviation of the horizontal load is detected by the mounting failure detection section 63.

In the electronic component mounting apparatus 10, a position in the space 604 that expresses the horizontal load applied to the electronic component 1 due to intrusion of the foreign object 80 or the like is outside the tolerance range 603 when the position deviates not only in the (+X) direction but also in another direction, and the mounting failure is detected by the mounting failure detection section 63.

If it is determined that the horizontal load is within the tolerance range 603 by the mounting failure detection section 63, then it is confirmed whether or not mounting of the electronic component 1 is ended by the control section 60 (step S24). If the mounting is not ended, program flow returns to step S21 to repeat measurement of the load and detection of the mounting failure (steps S21 through S23) until mounting of the electronic component 1 (pressurization of the electronic component 1 performed in accordance with the load profile 601) ends (step S24).

If mounting of the electronic component 1 is ended, then a displacement amount of the holding head 15a from a start of the mounting of the electronic component 1 (at a time of detection of contact of the electronic component 1 with the board 2) to an end (end of pressurization of the electronic component 1) is detected by the linear scale 70, transferred to the control section 60 (step S25) and compared with a displacement amount that becomes a reference (hereinafter referred to as a "reference displacement amount") preparatorily stored in the storage section 62 (step S26).

If this detected displacement amount is outside the tolerance range preparatorily related to the reference displacement amount, then the operator is informed of detection of a mounting failure of the electronic component 1 by lighting the warning lamp 64 by virtue of the mounting failure detection section 63, and this detection operation of the mounting failure ends (step S30). For example, if the electronic component 1 comes close to the board 2 more than necessary, as a consequence of collapse of the bump 1a of the electronic component 1 at a time of mounting or for another reason, then a detected displacement amount takes a great value outside the tolerance range, and such mounting failure is detected by the mounting failure detection section 63.

Moreover, if the displacement amount detected by the linear scale 70 is within the tolerance range of the reference displacement amount, then it is determined that placement (and mounting) of the electronic component 1 onto the board 2 has been normally ended, and a detection operation of a mounting failure ends. As described above, in the electronic component mounting apparatus 10, by comparing detection results of the load sensor 30 and the linear scale 70 with a tolerance range preparatorily stored in the storage section 62, a mounting failure of the electronic component 1 is detected by the mounting failure detection section 63. In the electronic component mounting apparatus 10, a mounting operation of the electronic component 1 is continued when a degree of the mounting failure is negligible even if the mounting failure is detected in steps S22 and S23, and detection of a load and displacement by the load sensor 30 and the linear scale 70 is continued until a mounting operation sequence ends, thereby consequently obtaining measurement results in steps (steps S22, S23 and S26) for detecting the mounting failure.

Figure 10:
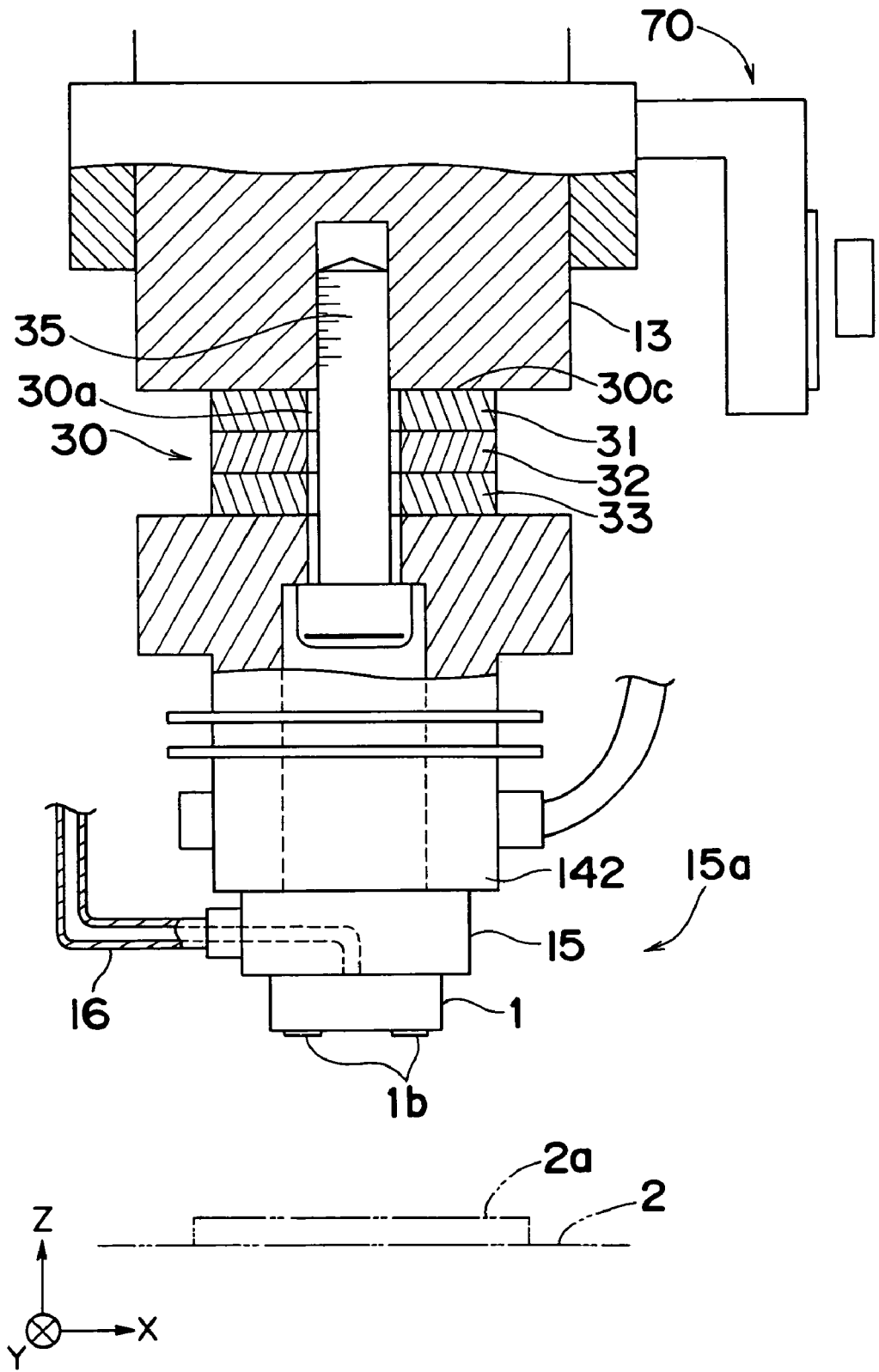
FIG. 10 is a sectional view showing another example of the installation structure of the holding head and the load sensor of the electronic component mounting apparatus of the first embodiment.

FIG. 10 is a view showing another example of the installation structure of load sensor 30 and holding head 15a. In FIG. 10, a heat block 142 having a heater is attached in place of the block 141, and a semiconductor bare chip, which is an IC, as electronic component 1, is held by holding section 15, as compared with the structure shown in FIG. 2. The holding head 15a is assembled as an integrated block of high rigidity with the holding section 15 and the heat block 142. Other constructions are similar to those of FIG. 2, and they are denoted by same reference numerals. Structure and an installation method of the load sensor 30 are also similar to those of FIG. 2. The load sensor 30 and the heat block 142 can be easily attached to or detached from shaft 13 by a bolt 35. Moreover, a linear scale 70 for measuring displacement in a Z-direction of the holding head 15a is provided on a (+X) side of the shaft 13.

In mounting the electronic component 1, a thermosetting anisotropic conductive resin film (ACF (Anisotropic Conductive Film)) (hereinafter referred to as an "ACF") 2a is preparatorily stuck on board 2, and the holding section 15 is preheated by the heat block 142. Therefore, when the electronic component 1 is held by the holding section 15, the electronic component 1 is heated via the holding section 15.

Then, the holding section 15 is moved down to pressurize the electronic component 1 on the board 2 via the ACF 2a, and conductive particles in the ACF 2a are collapsed to electrically bond electrodes 1b of the electronic component 1 to electrodes on the board 2. Concurrently with this bonding, the ACF 2a is heated and hardened via the electronic component 1, so that the electronic component 1 is fixed on the board 2. After the bonding ends, the holding section 15 releases suction and moves up.

Materials suitable for the piezoelectric element for the load sensor 30 will be described next. Table 1 shows relationships between the materials of the piezoelectric element and various constants.

Moreover, the load sensor 30 is directly attached to the holding head 15a that is an integrated block of high rigidity, and therefore, a load value detected by the load sensor 30 can be regarded as equivalent to a load applied to the electronic component 1. In particular, the load sensor 30 is arranged on a holding head 15a side with respect to the sliding portion of the slider 11 and the guide rail 12 in the Z-direction, which is the mounting direction of the electronic component 1, and therefore, the load value detected by the load sensor 30 does not receive influence of sliding resistance between the slider 11 and the guide rail 12. Therefore, in comparison with a conventional electronic component mounting apparatus, a measurement value close

TABLE 1

CONSTANTS OF PIEZOELECTRIC ELEMENTS

| | Curie Point (Tc) | Dielectric Constant | Piezoelectric Distortion Constant (d) | Piezoelectric Output Coefficient (g) | Temperature Coefficient | |
|---|---|---|---|---|---|---|
| | °C. | $\epsilon/\epsilon_0$ | m/v × $10^{-12}$ | Vm/N × $10^{-8}$ | d (%/°C.) | g (%/°C.) |
| Lead Zirconate Titanate Pb(Ti, Zr)O$_3$ | 320.0 | 2,000.0 | 320.0 | 24.0 | +0.08 | −0.19 |
| Lead Titanate PbTiO$_3$ | 490.0 | 300.0 | 50.0 | 30.0 | +0.15 | +0.04 |
| Crystal | 550.0 | 4.5 | 2.0 | 50.0 | −0.02 | −0.02 |
| Lead Niobate PbNb$_2$O$_6$ | 560.0 | 250.0 | 82.0 | 30.0 | +0.06 | +0.02 |
| Lithium Niobate LiNbO$_3$ | 1,210.0 | 30.0 | 16.0 | 2.3 | +0.03 | — |

For example, a crystal, of which a dielectric constant and piezoelectric distortion constant are low, and sensitivity is low, has a high Curie point and excellent stability. Therefore, when bonding is performed by use of a heater as shown in FIG. 10 and a measurement accuracy is required, it is preferable to use crystal. On the other hand, a piezoelectric ceramic such as lead zirconate titanate (Pb(TiZr)O$_3$), of which the Curie point is lower than that of crystal, has a high dielectric constant and high piezoelectric distortion constant and an excellent response characteristic. Moreover, piezoelectric ceramics have a feature in that they are easy to process into an arbitrary configuration and excellent in terms of mass productivity. For the above reasons, an optimum material is selected from the group consisting of crystal and piezoelectric ceramics in accordance with accuracy, a response characteristic, cost and the like required for the load sensor 30.

As described above, in the electronic component mounting apparatus 10, by detecting the horizontal load utilizing the piezoelectric elements 32 and 33 provided in a stack in the mounting direction of the electronic component 1, and detecting the vertical load utilizing the piezoelectric element 31 provided superposed on the piezoelectric elements 32 and 33, it is possible to reduce a size in the horizontal direction of the load sensor 30 and detect a load applied in three directions to the electronic component 1 at the neighborhood of the mounting position of the electronic component 1. As a result, it is possible to more accurately measure a load applied to the electronic component 1.

to a real load actually applied to the electronic component 1 can be obtained, and the load applied to the electronic component 1 in mounting of the electronic component 1 can be more accurately measured.

In the electronic component mounting apparatus 10, by comparing the vertical load applied to the electronic component 1 with the load profile 601 and detecting a deviation of the horizontal load applied to the electronic component 1 and/or an abnormality in a displacement amount of the electronic component 1 at a time of mounting, a mounting failure at a time of mounting the electronic component 1 can be accurately detected. Then, by removing the board 2 of which the mounting failure is detected as a defective component from a mass production process, occurrence of defective electronic equipment as a finished product can be prevented in advance.

In the electronic component mounting apparatus 10, it is acceptable to execute, by the control section 60, feedback control of the motor 50 that pressurizes the electronic component 1 against the board 2 by driving the holding head 15a on the basis of a result of comparison between a measurement value of the vertical load detected by the load sensor 30 and the load profile 601. As described above, in the electronic component mounting apparatus 10, the vertical load applied to the electronic component 1 can be accurately measured. Therefore, accurate control of the motor 50 can be executed, and it becomes possible to make variations in a vertical load applied to the electronic component 1 fall within a range of several grams. As a result, defective bonding of the electronic component 1 to the board 2, damage of the bumps 1*a* and the electrodes 1*b* at the bottom of the electronic component 1, damage of the electronic component 1 itself, or the like can be prevented from occurring.

In the electronic component mounting apparatus 10, a position, in which the horizontal load values in the X-direction and the Y-direction serve as coordinate values in the two-dimensional space 604, is compared with the tolerance range 603 that is a circular or elliptical region centered around the origin of the two-dimensional space 604. That is, the tolerance range 603 is determined with respect to a synthetic vector of weight vectors in the X-direction and the Y-direction, and therefore, detection of a mounting failure can be performed by taking deviations of the load in the X-direction and the Y-direction comprehensively into account. Moreover, by virtue of the elliptical tolerance range 603, a major axis and a minor axis of this ellipse can be changed in correspondence with a configuration of the electronic component 1, a difference in sensitivity between the piezoelectric element 32 in the X-direction and the piezoelectric element 33 in the Y-direction, or the like, and the tolerance range 603 can be appropriately set.

A load sensor, which employs a piezoelectric element, has a wider measurable range of load than that of a load cell that employs a strain gauge. Moreover, both crystal and piezoelectric ceramics, which are materials of the piezoelectric element, have almost no hysteresis of elastic deformation since they have higher rigidity and a smaller amount of deformation than a metallic elastic body that constitutes the load cell. Therefore, a load applied to the electronic component 1 can be more accurately measured. Furthermore, a load sensor, which employs a piezoelectric element, has a higher response speed than when a load cell is employed. Therefore, contact of the electronic component 1 with the board 2 can be more accurately detected, and a load applied to the electronic component 1 can be accurately measured even when the electronic component is mounted at high speed. Therefore, by employing the piezoelectric elements 31 through 33 for the load sensor 30, an electronic component mounting apparatus 10 of higher versatility can be provided.

Figure 11:
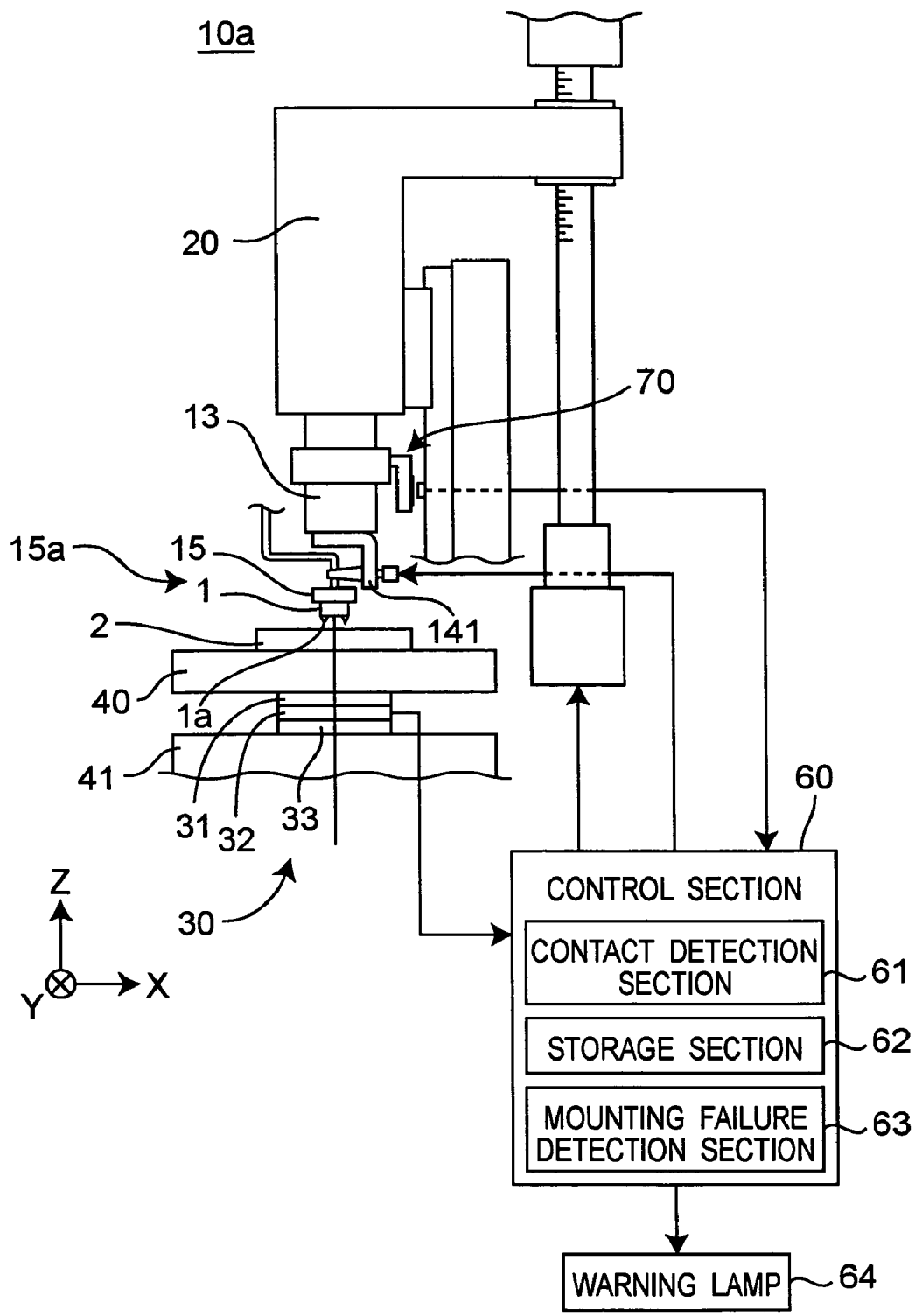
FIG. 11 is a front view showing a construction of an electronic component mounting apparatus according to a second embodiment of the present invention.
Figure 12:
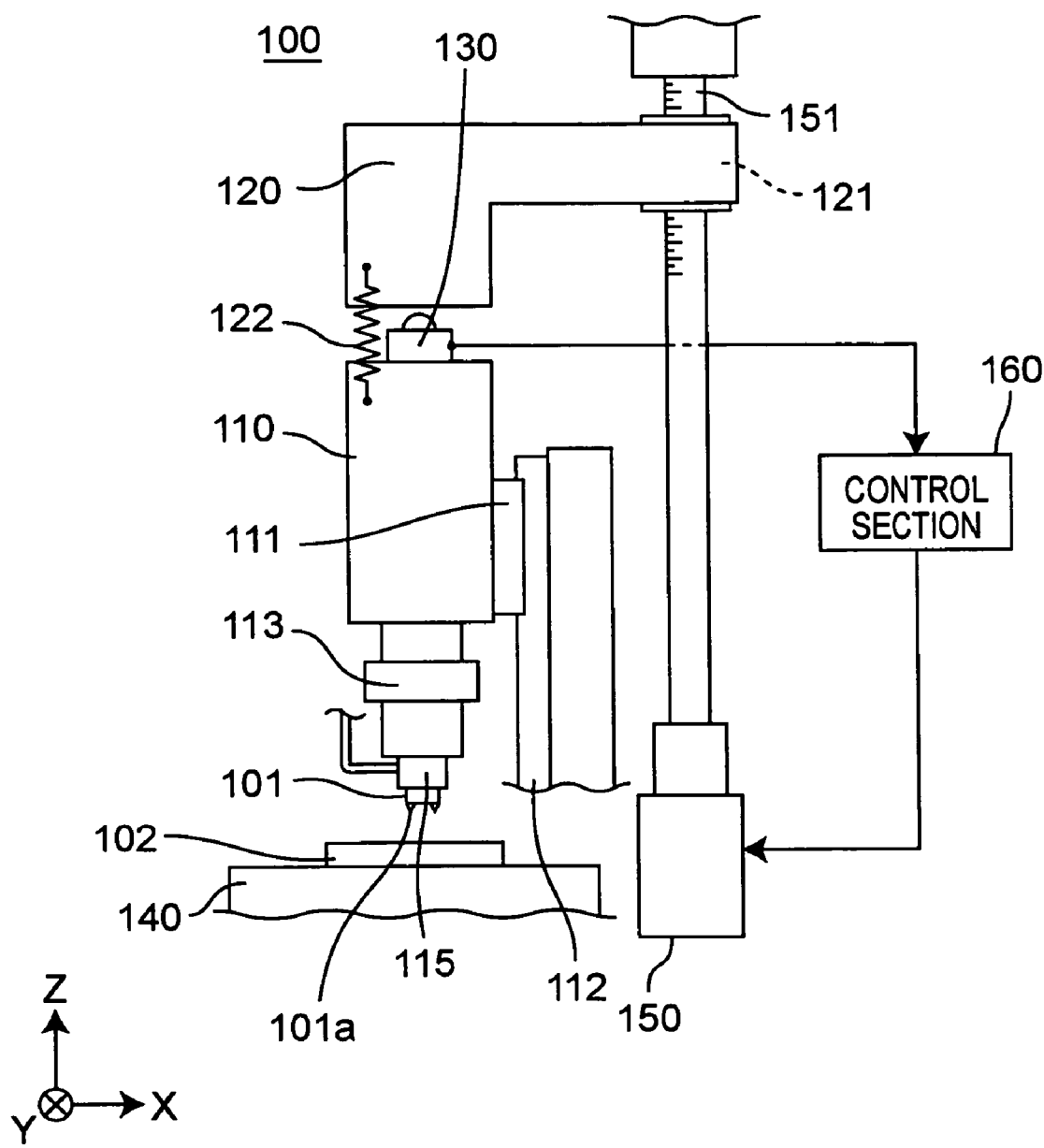
FIG. 12 is a front view showing a construction of a conventional electronic component mounting apparatus.

FIG. 11 is a view showing an electronic component mounting apparatus 10*a* according to a second embodiment of the present invention. In the electronic component mounting apparatus 10*a*, based on the electronic component mounting apparatus 10 shown in FIG. 1, load sensor 30 provided between block 141 and shaft 13 of movement block 20 is provided under table 40 (on a (−Z)-side), and the table 40 is supported on a base 41 via the load sensor 30. Other constructions are similar to those of FIG. 1, and they are denoted by same reference numerals in the following description.

In the electronic component mounting apparatus 10*a*, when electronic component 1 held by holding section 15 is mounted onto board 2 while being pressurized, a load applied to the board 2 (i.e., a load applied to the electronic component 1) is measured by the load sensor 30 arranged vertically below the holding section 15.

A mounting operation of the electronic component 1 by the electronic component mounting apparatus 10*a* is similar to that of the first embodiment. First of all, the board 2 is placed and held on the table 40, and the electronic component 1 sucked and held by the holding section 15 is moved down to a mounting position on the board 2, and contact of the electronic component 1with the board 2 is detected by contact detection section 61 of control section 60. Subsequently, pressurization of the electronic component 1 is started in accordance with load profile 601 (see FIG. 4) preparatorily stored in storage section 62, and placement and mounting of the electronic component 1 are concurrently performed by ultrasonic waves applied to the electronic component 1 pressurized with a prescribed load. Thereafter, the holding head 15*a* is moved up to complete the mounting of the electronic component 1 (FIG. 3: steps S11 through S18).

Even in the electronic component mounting apparatus 10*a*, a mounting failure of the electronic component 1 is detected by mounting failure detection section 63 on the basis of outputs from load sensor 30 and linear scale 70 at a time of mounting the electronic component 1. This detection operation of the mounting failure is also similar to that of the first embodiment. First of all, a vertical load and a horizontal load are detected by piezoelectric elements 31 through 33 of the load sensor 30 (FIG. 5: step S21), and it is confirmed whether or not the vertical load is within tolerance range 602 of the load profile 601 (step S22). If the vertical load is outside the tolerance range 602, then a mounting failure of the electronic component 1 is detected, and warning lamp 64 is lit (step S30).

If the vertical load is within the tolerance range 602, then a position, in which horizontal load values in an X-direction and Y-direction serve as coordinate values in two-dimensional space 604 in which the X-direction and the Y-direction of the load serve as an X-axis and Y-axis, is compared with the tolerance range 603 of the horizontal load (step S23). If the position is outside the tolerance range 603, a mounting failure of the electronic component 1 is detected (step S30). In the electronic component mounting apparatus 10*a*, detection of the mounting failure is repeated until mounting of the electronic component 1 ends (step S24).

If mounting of the electronic component 1 ends, then a displacement amount in a Z-direction of the holding head 15*a* from a start to end of the mounting of the electronic component 1 is detected by the linear scale 70 and compared with a reference displacement amount (steps S25 and S26). A mounting failure of the electronic component 1 is detected when the displacement amount falls outside a tolerance range of the reference displacement amount (step S30), and a detection operation of the mounting failure ends when the displacement amount falls within the tolerance range.

As described above, the electronic component mounting apparatus 10*a* is able to detect a load applied to the electronic component 1 at a neighborhood of the mounting position of the electronic component 1 while reducing a size in a horizontal direction of the load sensor 30 by virtue of the piezoelectric elements 31 through 33 provided in a stack in mounting direction of the electronic component 1 similarly to the first embodiment. Moreover, the load sensor 30 is provided just under the mounting position of the electronic component 1 in a position in which influence of sliding resistance of slider 11 and guide rail 12 is not exerted, and therefore, a load applied to the electronic component 1 can be more accurately measured.

In the electronic component mounting apparatus 10*a*, by comparing a vertical load applied to the electronic component 1 with the load profile 601, or detecting a deviation of a horizontal load applied to the electronic component 1 and an abnormality in a displacement amount of the electronic component 1 at a time of mounting, a mounting failure at the time of mounting the electronic component 1 can be accurately detected. Furthermore, by comparing a deviation of the horizontal load with the tolerance range 603 appropriately set in correspondence with a configuration of the electronic component 1 and the like, detection of a mounting failure can be performed taking deviations in the X-direction and the Y-direction comprehensively into account.

Moreover, by employing the piezoelectric elements 31 through 33 for the load sensor 30, electronic component mounting apparatus 10a of higher versatility can be provided.

Although the embodiments of the present invention have been described above, the present invention is not limited to the aforementioned embodiments but allowed to be modified in a variety of ways.

For example, a ball spline may be employed as a mechanism for guiding movement of the movement block 20. In this case, direction of an electronic component may be made changeable by pivoting the ball spline in its entirety around a central axis.

Moreover, although a piezoelectric element has been employed as the load sensor in the aforementioned embodiments, a load cell may be employed similarly to a conventional case depending on a magnitude of a load and a load detection accuracy. Even in the above case, a measurement value close to a real load actually applied to an electronic component can be obtained since no error component ascribed to sliding resistance of a guide mechanism or the like is included in a load detected by the load sensor, and a load to be applied to an electronic component at a time of mounting the electronic component can be more accurately controlled.

The electronic component mounting apparatus can be utilized for various cases of mounting various electronic components. For example, it is acceptable to preparatorily mount (temporary bond) an electronic component to, for example, solder bumps on a board by use of the electronic component mounting apparatus, and bond the electronic component to the board by melting and solidifying the solder bumps by reflow in a next process. Moreover, it is acceptable to temporarily pressure-bond an electronic component onto a board on which a thermosetting resin film has been stuck, and use the electronic component mounting apparatus for main pressure bonding to be performed separately with pressurization and heating.

The electronic component to be mounted by the electronic component mounting apparatus may be, for example, an electronic component other than a semiconductor light-emitting element of an LED chip, a semiconductor laser, or the like, a packaged IC, a fine semiconductor chip of a resistor, a capacitor, or the like, or an SAW (Surface Acoustic Wave) filter other than a semiconductor. The board may be formed of a material of glass, a semiconductor, or the like other than resin. The electronic component may be held in a mounting stage by a mechanical chuck or an electrostatic chuck besides suction with a negative pressure of the aforementioned embodiments.

The present invention can be utilized for an electronic component mounting apparatus that mounts an electronic component onto a circuit board.

According to the present invention, by detecting a horizontal load by use of piezoelectric elements, a size in a horizontal direction of a load sensor can be reduced, and the load can be detected at a neighborhood of a mounting position. Moreover, a mounting failure of the electronic component can be accurately detected from deviation of the horizontal load. According to the second aspect of the present invention, a mounting failure of the electronic component can be accurately detected from a vertical load.

According to the third aspect of the present invention, a tolerance range corresponding to a load profile can be set for a horizontal load. According to the fourth aspect of the present invention, a mounting failure can be detected by taking deviations of a load in the X-direction and the Y-direction comprehensively into account.

According to the present invention, a load applied to the electronic component is measured by a load sensor provided between a movement block and a holding head. Therefore, the load applied to the electronic component at a time of mounting the electronic component can be more accurately measured without receiving influence of sliding resistance or the like due to a guide mechanism for guiding the movement block. According to the tenth aspect of the present invention, the load applied to the electronic component can be more accurately measured.

According to the eighth aspect of the present invention, a mounting failure of the electronic component can be accurately detected from a vertical load. According to the ninth aspect of the present invention, a mounting failure of the electronic component can be accurately detected from deviation of a horizontal load. According to the twelfth aspect of the present invention, a mounting failure of an electronic component can be accurately detected from a displacement amount of the electronic component.

According to the seventeenth aspect of the present invention, the load sensor can easily be attached and detached in a prescribed posture.

By properly combining arbitrary embodiments of the aforementioned various embodiments, effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. An apparatus for mounting an electronic component onto a board, comprising:
    a board holding section for holding a board;
    a holding head for holding an electronic component;
    a load sensor attached to one of said holding head and said board holding section, said load sensor having two piezoelectric elements, stacked in a mounting direction of the electronic component when the electronic component is held by said holding head, for generating voltages upon receiving loads in two directions that are roughly perpendicular to the mounting direction and roughly mutually intersect each other, and for thereby allowing said load sensor to detect values of the loads in the two directions; and
    a mounting failure detection section for comparing a position in a two-dimensional space, in which the values of the loads in the two directions as detected by said load sensor serve as coordinate values, with a preset tolerance range in the two-dimensional space, and for thereby determining whether a mounting failure of the electronic component exists.

2. The apparatus according to claim 1, further comprising:
    a storage section for preparatorily storing a load profile that expresses a time-based change in another load to be applied to the electronic component, in a third direction that is roughly parallel to the mounting direction, during mounting of the electronic component onto the board,
    wherein said load sensor further includes a third piezoelectric element, stacked on said two piezoelectric elements, for generating a voltage upon receiving a load in the third direction, and for thereby allowing said load sensor to detect a value of the load in the third direction, and wherein said mounting failure detection section is also for determining whether a mounting failure of the electronic component exists by comparing a value of a load in the third direction, as detected by said load sensor, with the load profile stored in said storage section.

3. The apparatus according to claim 2, wherein based on the load profile stored in said storage section, the tolerance range in the two-dimensional space is to be expanded or contracted around an origin of the two-dimensional space.

4. The apparatus according to claim 3, wherein the tolerance range in the two-dimensional space is one of a circular region and elliptical region centered around the origin of the two-dimensional space.

5. The apparatus according to claim 1, wherein the mounting failure of the electronic component corresponds to at least one of
   (i) a foreign object between the electronic component and said holding head, during mounting of the electronic component onto the board,
   (ii) a foreign object between the electronic component and the board, during mounting of the electronic component onto the board, and
   (iii) a foreign object between the board and said board holding section, during mounting of the electronic component onto the board.

6. An apparatus for mounting an electronic component onto a board, comprising:
   a movement block capable of being driven in a mounting direction of an electronic component;
   a holding head for holding the electronic component, said holding head being an integrated block of high rigidity;
   a load sensor, positioned between said movement block and said holding head and supporting said holding head, for detecting a value of a first load in a first direction roughly parallel to the mounting direction, and for detecting values of two other loads in two directions that are roughly perpendicular to the mounting direction and roughly mutually intersect each other;
   a guide mechanism for movably guiding said movement block in the mounting direction; and
   a drive mechanism for driving said movement block in the mounting direction.

7. The apparatus according to claim 6, further comprising:
   a storage section for preparatorily storing a load profile that expresses a time-based change in a load to be applied to the electronic component, in the first direction, during mounting of the electronic component onto the board;
   a control section for controlling driving of said movement block, by said drive mechanism, according to the load profile stored in said storage section; and
   a mounting failure detection section for determining whether a mounting failure of the electronic component exists by comparing a value of the first load, as detected by said load sensor, with the load profile stored in said storage section.

8. The apparatus according to claim 7, further comprising:
   a displacement sensor for detecting a displacement amount, in the first direction, of said holding head,
   wherein said mounting failure detection section is also for detecting a mounting failure of the electronic component by comparing a displacement amount of said holding head, from commencement of mounting of the electronic component onto the board to completion of mounting of the electronic component onto the board, as detected by said displacement sensor, with a reference displacement amount preparatorily stored in said storage section.

9. The apparatus according to claim 6, wherein said load sensor comprises a piezoelectric element.

10. The apparatus according to claim 9, wherein said piezoelectric element is made of a piezoelectric ceramic or crystal.

11. The apparatus according to claim 6, wherein said load sensor comprises three piezoelectric elements for generating voltages upon receiving the first load and the two other loads.

12. The apparatus according to claim 11, further comprising:
   a mounting failure detection section for comparing a position in a two-dimensional space, in which the values of the two other loads as detected by said load sensor serve as coordinate values, with a preset tolerance range in the two-dimensional space, and for thereby determining whether a mounting failure of the electronic component exists.

13. The apparatus according to claim 6, wherein the electronic component is a semiconductor bare chip.

14. The apparatus according to claim 6, wherein the electronic component is to be bonded to the board via a thermosetting resin by being heated with a prescribed load applied thereto.

15. The apparatus according to claim 6, wherein the electronic component is to be bonded to the board by ultrasonic waves applied with a prescribed load applied thereto.

16. The apparatus according to claim 6, wherein said load sensor comprises
   (i) a first attachment face to which said holding head is affixed, and
   (ii) a second attachment face parallel to said first attachment face and attached to said movement block.

17. The apparatus according to claim 6, further comprising:
   a storage section for preparatorily storing a reference displacement amount; and
   a displacement sensor for detecting a displacement amount, in the first direction, of said holding head,
   wherein said mounting failure detection section is for detecting a mounting failure of the electronic component by comparing a displacement amount of said holding head, from commencement of mounting of the electronic component onto the board to completion of mounting of the electronic component onto the board, as detected by said displacement sensor, with the reference displacement amount preparatorily stored in said storage section.

18. The apparatus according to claim 6, further comprising:
   a mounting failure detection section for comparing a position in a two-dimensional space, in which the values of the two other loads as detected by said load sensor serve as coordinate values, with a preset tolerance range in the two-dimensional space, and for thereby determining whether a mounting failure of the electronic component exists.

* * * * *